April 3, 1962 K. KLINGSPORN 3,028,262

METHOD FOR THE FREQUENCY TUNING OF PIEZOELECTRIC CRYSTAL OSCILLATORS

Filed June 25, 1959

INVENTOR:
K. Klingsporn
BY Lowry & Rinehart
ATTYS.

United States Patent Office 3,028,262

Patented Apr. 3, 1962

3,028,262

METHOD FOR THE FREQUENCY TUNING OF PIEZOELECTRIC CRYSTAL OSCILLATORS

Kurt Klingsporn, Waibstadter Strasse, Neckarbischofsheim, Germany

Filed June 25, 1959, Ser. No. 822,823
4 Claims. (Cl. 117—107)

Figure 1:
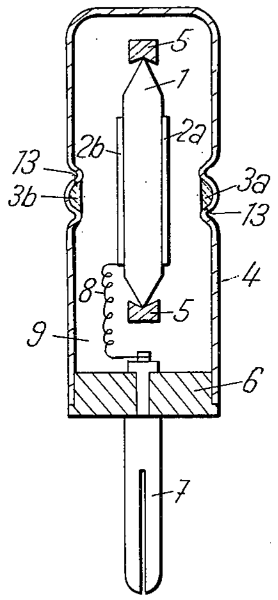

This invention relates to piezoelectric crystal oscillators, and more specifically to a method for the frequency tuning of piezoelectric crystal oscillators.

In the production of crystal oscillators the difficulty arises that the manipulations which are still necessary after the frequency tuning of a crystal oscillator, that is for example the mounting in a holder, evacuation and the like, cause changes in frequency and as a result these changes in frequency still stray a great deal. This limits the tuning accuracy of the crystal oscillator considerably, because this straying is not tangible. The actual requirements as regards frequency accuracy are in the same order as this straying. Consequently the demands of the instrument builders, who for many reasons wish to save the trimming condenser for each individual crystal oscillator in the transmitter, can scarcely be met.

It is the object of the present invention to overcome the above-mentioned objection and to render possible frequency tuning with a considerably great degree of accuracy. The fundamental idea of the invention is to undertake the frequency tuning as the last of all manipulations in the production of a crystal oscillator, that is after the fitting of the crystal in the crystal holder and the eventual evacuation or filling thereof with gases.

Consequently the method for the frequency tuning of piezoelectric crystal oscillators consists in that the crystal already built in its holder and airtightly enclosed by a housing is brought to a precalculated frequency in that substances, such as metal layers deposited in the interior of the housing preferably indirectly accessible from the outside, are brought on to the crystal for example by vaporizing, cathode disintegration or the like, which is continued until the desired frequency is reached.

According to another feature of the invention the substances, particularly precious metals such as silver, gold or the like, are applied to the inner side of the housing or on the electrodes of the crystal oscillator holder, preferably in cavities provided therefor.

Provision is also made according to the invention for selecting the substances which are to be used so that their physical and chemical properties differ very considerably from one another, for example the material of the housing or cap or of the electrode differs very considerably from the substance used for the frequency tuning, particularly as regards melting point, vapor tension and heat conductivity.

An additional evaporation of such substances on to the surfaces of the crystals is effected by heating those places where the substances are deposited, from outside by sources of energy such as a soldering iron, a spot welder or the like, until the evaporating temperature of the substance is reached.

The tuning can also be effected according to the invention by using the cathodic evaporation process in that a high electric voltage is fed to the electrodes of the crystal and the cap, whereby the intensity of the electric field produced effects the tuning.

Even in the case of non-metallized crystal oscillators a similar tuning can be effected according to the invention in that, in the case of air-gap crystals with separate electrodes, these electrodes are utilized as carriers of the substances for the additional metallizing.

The method according to the invention is not restricted to particular types of crystals. It can be used just as satisfactorily for frequency tuning in the case of those crystals with normal air pressure in the interior as well as in the case of crystals evacuated or filled with special gases.

Finally, as regards the application of the additional substances, it has also been found that this should not take place in the middle of the crystal or just anywhere, but preferably precisely at the places where a particularly frequency-effective point develops on the surface of the crystal for example a mechanical loop of oscillation or internode.

Figure 2:
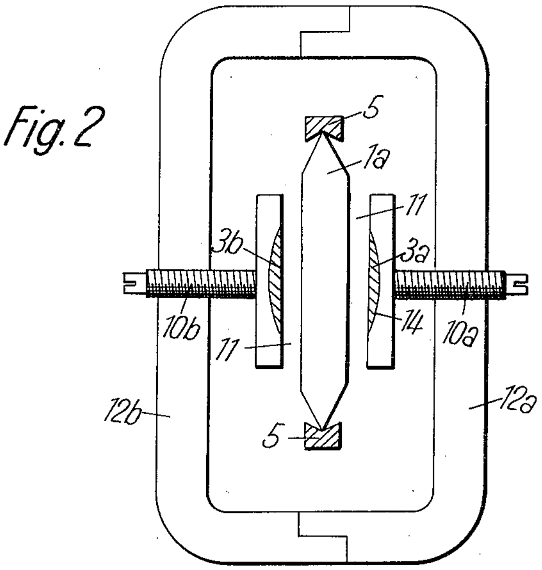

Examples of the application of the method according to the invention are illustrated in the accompanying drawing, in which:

FIG. 1 is a vertical section through a plug element with a metallized crystal, and FIG. 2 is a horizontal section through a housing element with non-metallized crystal.

In the example illustrated in FIG. 1, a crystal 1 is mounted as oscillator quartz vibrator secured in suitable operative position in a plug housing between holding elements 5. The sides of the crystal 1 are provided with electrodes 2*a* and 2*b* applied by evaporation. These electrodes 2*a* and 2*b* can also be applied by welding on silver or gold. A cap 4 is made, for example from metal and has on its broad sides impressed inner cavities 13. Here a metal substance 3*a*, 3*b* with low melting point and high vapor tension is, for example, stored for additional evaporation so that it is located exactly opposite the middle of the metal electrode of the crystal. The cap 4 is fitted in a corresponding edge recess of a base piece 6 which is equipped with current feeding elements in the form of two conventional plug pins 7. The current feed between the two plugs 7 and the crystal 1 is effected by wires 8 in the space 9 of the cap 4. The space 9 can be filled with air at normal pressure or with inert gas. The pressure here can in both cases also be considerably reduced, that is evacuated.

The tuning can now be effected in that the places of the cap 4 where the metal substance 3*a*, 3*b* with low melting point and high vapor tension is located, are heated from outside the cap for example by means of a soldering iron or a spot welder. As a result a portion of the metal substance 3*a*, 3*b* evaporates and deposits on the electrodes 2*a* and 2*b* thereby causing a change in frequency. The heating is continued until the desired frequency is attained.

FIG. 2 shows another example of the application of the method; therein a housing element accommodates a non-metallized crystal 1*a* in holders 5 and carries in the two housing parts 12*a* and 12*b* connected by off-set edge formations, electrodes 10*a* and 10*b* shiftable by means of screws and serving at the same time as terminals. By means of the screws the air gap 11 between each electrode and the broad side of the crystal 1*a* can be changed from outside. These electrodes are also provided with cavities 14 carrying metal substances 3*a*, 3*b* which are used for the frequency tuning, as in the example illustrated in FIG. 1.

Of course, various changes may be made in the details disclosed in the foregoing specification without departing from the invention and the claims annexed hereto.

I claim:

1. A method for frequency tuning the crystal of piezoelectric crystal oscillators comprising, mounting a crystal in a sealed housing, applying a current to said crystal to adjust said crystal to a previously calculated frequency, providing a source of vaporizable metallic material in heat conducting relationship in said housing in an optimum spot position relative to the crystal to alter said crystal frequency when evaporated during tuning of said crystal, and evaporating said metallic material by conduction of heat through said housing.

2. The method of claim 1; forming recesses in said housing for positioning said source of vaporizable metallic material in said housing prior to installation and sealing of the crystal therein in the optimum position for coating said crystal.

3. The method of claim 1; constructing said housing of a material having higher melting point and lower vapor density than said vaporizable metallic material.

4. The method of claim 1; constructing said crystal as an air-gap crystal, and adjustably supporting said vaporizable metallic material for lateral movement with respect to opposite sides of said crystal.

References Cited in the file of this patent

UNITED STATES PATENTS

| | | |
|---|---|---|
| 2,505,370 | Sykes | Apr. 25, 1950 |
| 2,727,296 | Craiglow | Dec. 20, 1955 |
| 2,765,765 | Bigler et al. | Oct. 9, 1956 |
| 2,808,523 | Holmbeck | Oct. 1, 1957 |
| 2,816,239 | Berge | Dec. 10, 1957 |